US012717979B2

(12) United States Patent
Okada et al.

(10) Patent No.: US 12,717,979 B2
(45) Date of Patent: Aug. 25, 2026

(54) CURVED SURFACE FITTING METHOD, CURVED SURFACE FITTING DEVICE, CURVED SURFACE FITTING PROGRAM, AND COMPUTER-READABLE STORAGE MEDIUM STORING CURVED SURFACE FITTING PROGRAM

(71) Applicants: MAZDA MOTOR CORPORATION, Hiroshima (JP); NATIONAL UNIVERSITY CORPORATION SHIZUOKA UNIVERSITY, Shizuoka (JP)

(72) Inventors: Mataharu Okada, Aki-gun (JP); Kenjiro Miura, Hamamatsu (JP); Yuto Nakamura, Hamamatsu (JP)

(73) Assignees: MAZDA MOTOR CORPORATION, Hiroshima (JP); NATIONAL UNIVERSITY CORPORATION SHIZUOKA UNIVERSITY, Shizuoka (JP)

(*) Notice: Subject to any disclaimer, the term of this patent is extended or adjusted under 35 U.S.C. 154(b) by 1143 days.

(21) Appl. No.: 17/639,256

(22) PCT Filed: Aug. 24, 2020

(86) PCT No.: PCT/JP2020/031894
§ 371 (c)(1),
(2) Date: Feb. 28, 2022

(87) PCT Pub. No.: WO2021/044891
PCT Pub. Date: Mar. 11, 2021

(65) Prior Publication Data

US 2022/0335170 A1 Oct. 20, 2022

(30) Foreign Application Priority Data

Sep. 2, 2019 (JP) ................................ 2019-159915

(51) Int. Cl.
*G06F 30/10* (2020.01)
*B29C 33/38* (2006.01)
(Continued)

(52) U.S. Cl.
CPC .......... *G06F 30/10* (2020.01); *B29C 33/3835* (2013.01); *G06T 17/30* (2013.01); *G06T 19/20* (2013.01); *B29K 2905/00* (2013.01); *G06T 2219/2004* (2013.01); *G06T 2219/2021* (2013.01)

(58) Field of Classification Search
None
See application file for complete search history.

(56) References Cited

U.S. PATENT DOCUMENTS

2003/0020710 A1* 1/2003 Biermann ............... G06T 17/20 345/440
2005/0248562 A1* 11/2005 Maystrovsky .......... G06F 30/10 345/419

(Continued)

FOREIGN PATENT DOCUMENTS

EP 2442279 A1 * 4/2012 ............ G06T 17/30
JP 2004-78309 A 3/2004
WO WO-2016083085 A1 * 6/2016 ............ G06T 19/20

OTHER PUBLICATIONS

Yahara, Hiroki, et al. "Estimation of anatomical landmark positions from model of 3âdimensional foot by the FFD method." Systems and Computers in Japan 36.6 (2005): 26-38. (Year: 2005).*

(Continued)

*Primary Examiner* — Rehana Perveen
(74) *Attorney, Agent, or Firm* — Studebaker Brackett PLLC

(57) ABSTRACT

A method is provided for fitting a curved surface model in a three-dimensional space to a plurality of object points in the three-dimensional space by causing a computer to perform free-form deformation (FFD). Embodiments include (Continued)

the steps of setting closest points corresponding to measurement points on a curved surface model, determining the movement amounts of control points by executing a least squares method to minimize the sum of squares of the distances between the closest points and the measurement points, and fitting the curved surface model to the measurement points by executing FFD based on the movement amounts.

17 Claims, 15 Drawing Sheets

(51) Int. Cl.
*G06T 17/30* (2006.01)
*G06T 19/20* (2011.01)

(56) References Cited

U.S. PATENT DOCUMENTS

2006/0017723 A1* 1/2006 Baran .................... G06T 19/20 345/419
2017/0333018 A1* 11/2017 Sehat .................. A61B 17/025
2019/0239926 A1* 8/2019 Pavlovskaia ........... G06T 19/20

OTHER PUBLICATIONS

Hsu, William M., John F. Hughes, and Henry Kaufman. "Direct manipulation of free-form deformations." ACM Siggraph Computer Graphics 26.2 (1992): 177-184. (Year: 1992).*
International Search Report issued in PCT/JP2020/031894; mailed Oct. 27, 2020.

* cited by examiner

CURVED SURFACE FITTING METHOD, CURVED SURFACE FITTING DEVICE, CURVED SURFACE FITTING PROGRAM, AND COMPUTER-READABLE STORAGE MEDIUM STORING CURVED SURFACE FITTING PROGRAM

TECHNICAL FIELD

The technology disclosed herein relates to a curved surface fitting method, a curved surface fitting device, a curved surface fitting program, and a computer-readable storage medium that stores the fitting program.

BACKGROUND ART

So-called free-form deformation (FFD) is widely known as a method for fitting a curved surface. FFD is a method of deforming a curved surface via a volume covering the curved surface by deforming the volume.

For example, JP-A-2004-78309 discloses an FFD method (GFFD) based on a Gaussian function.

SUMMARY

General FFD deforms the volume described above by setting a plurality of grid points (so-called control points) in the volume and moving the control points.

Here, when a curved surface is finely deformed as in, for example, the outer panel component of an automobile, the number of control points becomes larger than in the case in which simpler deformation is sufficient. Conventionally, when there are many control points, the movement amounts of the control points cannot be systematically determined while clarifying the theoretical evidence.

The technology disclosed herein addresses this problem with the goal of systematically determining the movement amounts of the control points in FFD while clarifying the theoretical evidence.

The technology disclosed herein relates to a curved surface fitting method for fitting a curved surface model set in a three-dimensional space to a plurality of object points set in the three-dimensional space by causing a computer to perform free-form deformation.

The curved surface fitting method includes a control point setting process of setting a plurality of control points in the free-form deformation so that the control points surround at least part of the curved surface model; a deformation target point setting process of setting, on the curved surface model, a plurality of deformation target points corresponding to the plurality of object points, respectively; a movement amount determination process of determining movement amounts of the plurality of control points, respectively, by executing a least squares method so as to minimize a total value obtained by adding up squares of distances between the deformation target points and the object points corresponding to the deformation target points; and an FFD execution process of fitting the curved surface model to the plurality of object points by executing the free-form deformation based on the movement amounts.

This method can determine the movement amounts of the control points in the free-form deformation (FFD) by a least squares method that uses the sum of the squares of the distances between the deformation target points and the plurality of object points. This can systematically determine the movement amounts of the control points while clarifying the theoretical evidence.

In addition, the plurality of object points may include a plurality of measurement points obtained by measuring a surface shape of a metal mold.

This method can appropriately calculate the movement amounts of the control points even when using the measurement points that may contain noise or the like as the object points.

In addition, the deformation target points may be set as the closest points with respect to the object points on the curved surface model.

This method is advantageous in setting the deformation target points appropriately and therefore determining the movement amounts of the control points systematically.

In addition, the curved surface model may include a combination of curved surfaces, and the curved surface fitting method may execute the control point setting process, the deformation target point setting process, the movement amount determination process, and the FFD execution process so as to deform the plurality of curved surfaces at the same time.

This method can fit curved surface models having various forms.

In addition, the curved surface model may include a combination of a curved surface that partitions a domain of the curved surface model and a trimmed surface obtained by trimming the curved surface, and the curved surface fitting method may execute the control point setting process, the deformation target point setting process, the movement amount determination process, and the FFD execution process on a boundary between the curved surface and the trimmed surface.

This method performs FFD on the boundary of a trimmed surface. Here, by using the deformation result for the curved surface together, it is possible to fit the curved surface model while maintaining the continuity of the boundary between the curved surface and the trimmed surface, the continuity of tangent plane between the curved surface and the trimmed surface, and the continuity of the curvature between the curved surface and the trimmed surface.

In addition, the curved surface fitting method repeatedly executes the free-form deformation a plurality of times by dividing the movement amounts determined in the movement amount determination process and performing the FFD execution process based on the divided movement amounts.

This method can achieve more accurate deformation and suppress the spread of the curved surface by performing FFD at multiple stages.

In addition, the curved surface fitting method may further include the process of extrapolating a curved surface to the curved surface model, and the process of setting the deformation target points on the extrapolated curved surface.

This method can achieve smoother fitting by suppressing undulation near the boundary of the curved surface.

In addition, the curved surface fitting method may further include the process of adding the object points so as to correspond to the extrapolated curved surface.

In addition, the control point setting process may set a volume that covers the curved surface model and dispose the plurality of control points in the volume.

Another technology disclosed herein relates to a curved surface fitting device including a computer having a calculation unit, the curved surface fitting device fitting a curved surface model set in a three-dimensional space to a plurality of object points set in the three-dimensional space by causing the computer to perform free-form deformation. The calculation unit includes a control point setting unit that sets a plurality of control points in the free-form deformation so that the control points surround at least part of the curved surface model; a deformation target point setting unit that sets, on the curved surface model, a plurality of deformation target points corresponding to the plurality of object points, respectively; a movement amount determination unit that determines movement amounts of the plurality of control points, respectively, by executing a least squares method so as to minimize a total value obtained by adding up squares of distances between the deformation target points and the object points corresponding to the deformation target points; and an FFD execution unit that fits the curved surface model to the plurality of object points by executing the free-form deformation based on the movement amounts.

This structure can systematically determine the movement amounts of the control points while clarifying the theoretical evidence.

Another technology disclosed herein relates to a curved surface fitting program that fits a curved surface model set in a three-dimensional space to a plurality of object points set in the three-dimensional space by causing a computer to perform free-form deformation. The curved surface fitting program causes the computer to perform the procedure comprising: the step of setting a plurality of control points in the free-form deformation so that the control points surround at least part of the curved surface model; the step of setting, on the curved surface model, a plurality of deformation target points corresponding to the plurality of object points, respectively; the step of determining movement amounts of the plurality of control points, respectively, by executing a least squares method so as to minimize a total value obtained by adding up squares of distances between the deformation target points and the object points corresponding to the deformation target points; and the step of fitting the curved surface model to the plurality of object points by executing the free-form deformation based on the movement amounts.

This program can systematically determine the movement amounts of the control points while clarifying the theoretical evidence.

Another technology disclosed herein relates to a computer-readable storage medium that stores the fitting program.

This storage medium can systematically determine the movement amounts of the control points while clarifying the theoretical evidence.

As described above, the curved surface fitting method, the curved surface fitting device, the curved surface fitting program, and the computer-readable recording medium that stores the curved surface fitting program can systematically determine the movement amounts of the control points while clarifying the theoretical evidence.

DETAILED DESCRIPTION

Embodiments of the present disclosure will be described with reference to the drawings. The following description is an example.

Device Structure

Figure 1:
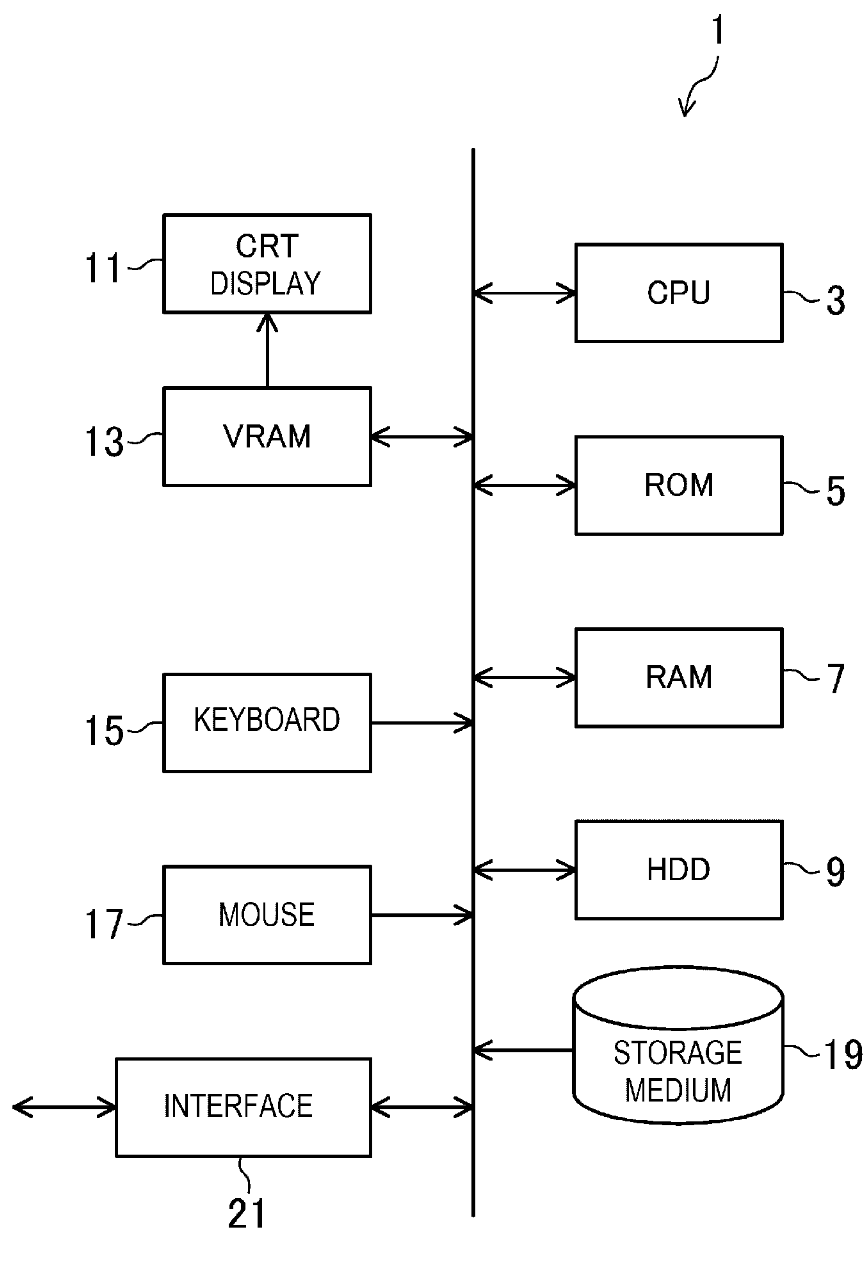
FIG. 1 is a diagram illustrating the hardware structure of a curved surface fitting device.
Figure 2:
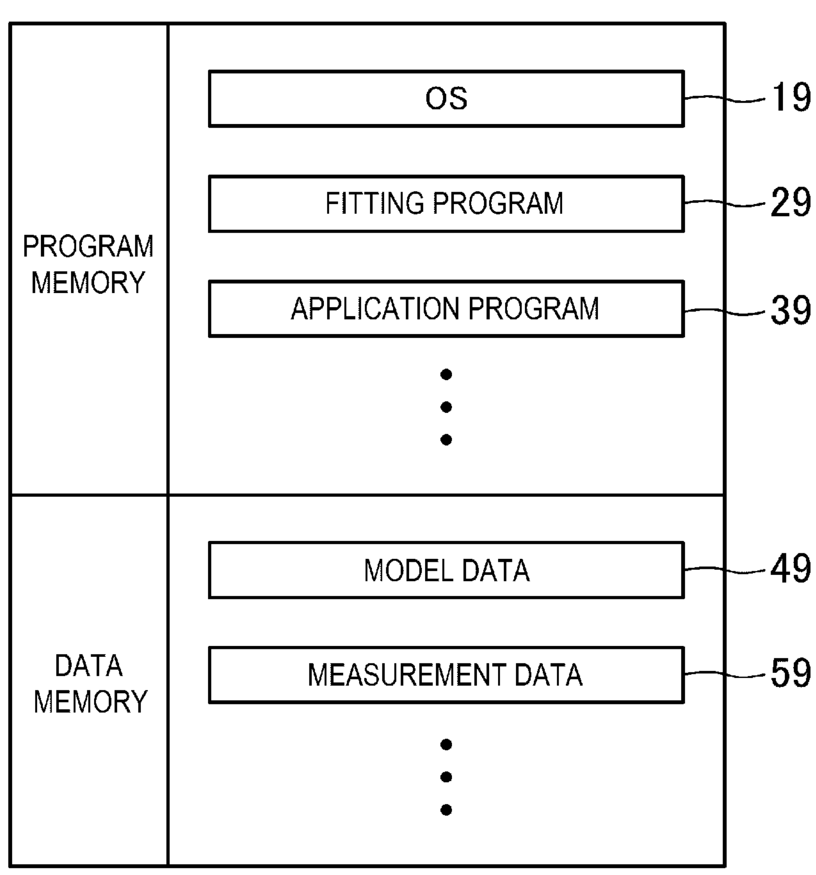
FIG. 2 is a diagram illustrating the software structure of the curved surface fitting device.

FIG. 1 is a diagram illustrating the hardware structure of a curved surface fitting device (specifically, a computer 1 included in the fitting device) according to the present disclosure and FIG. 2 is a diagram illustrating the software structure thereof.

The computer 1 illustrated in FIG. 1 includes a central processing unit (CPU) 3 that controls the entire computer 1, a read-only memory (ROM) 5 that stores a boot program and the like, a random access memory (RAM) 7 that functions as the main memory, a hard disk drive (HDD) 9 as a secondary storage device, a display 11 that displays fitting results and the like, a graphics memory (video RAM: VRAM) 13 that functions as a memory for storing image data to be displayed on the display 11, and a keyboard 15 and a mouse 17 as input devices. In addition, this computer 1 can communicate with external devices via an interface 21.

As illustrated in FIG. 2, the program memory of the HDD 9 stores an operating system (OS) 19, a curved surface fitting program 29, an application program 39, and the like.

Of these, the curved surface fitting program 29 executes a curved surface fitting method described later and causes the CPU 3 to execute the procedure corresponding to the processes (steps S1 to S5 in FIG. 4) constituting this processing method. As illustrated in FIG. 1, the curved surface fitting program 29 is stored in a computer-readable storage medium 19 in advance.

On the other hand, the data memory of the HDD 9 stores model data 49 indicating a curved surface model S to be deformed, measurement data 59 indicating a plurality of object points that are deformation objects of the curved surface model S.

It should be noted that a three-dimensional curved surface that models a metal mold can be used as the curved surface model S. In this case, a plurality of measurement points Q obtained by measuring the surface shape of the metal mold can be used as the plurality of object points. In the embodiment, the structure related to the curved surface model S in general will be described and then the structure related to a specific curved surface model such as a curved surface model S including a plurality of curved surfaces S1 and S2 will be described.

Other than the above, the curved surface model after being fitted that is created by execution of the fitting program 29 and various calculation results that are created by execution of the application program 39 are also stored in the data memory of the HDD 9.

Figure 17:
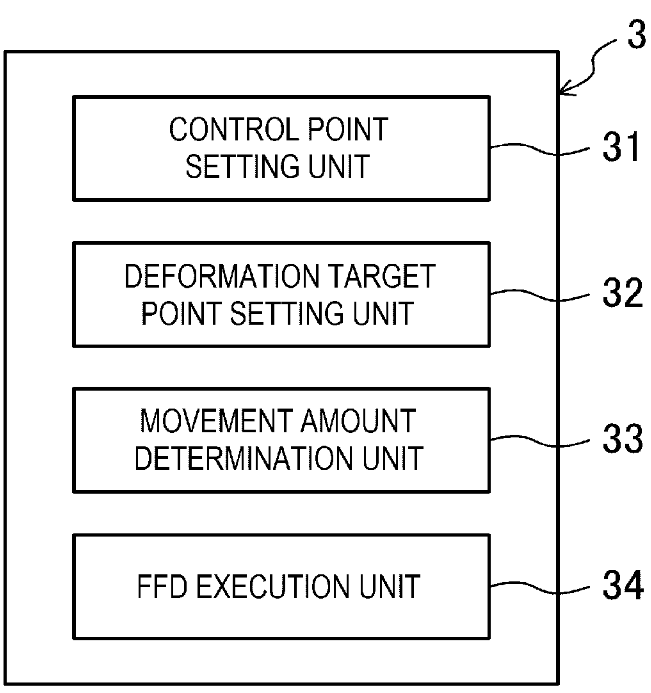
FIG. 17 is a diagram illustrating the structure of a CPU as a calculation unit.

In the structure described above, the fitting program 29 and the application program 39 are started in response to a command input through the keyboard 15 or the mouse 17. At that time, the fitting program 29 and the application program 39 are loaded from the HDD 9 to the RAM 7 and executed by the CPU 3. When the CPU 3 executes the fitting program 29 and the application program 39, the computer 1 functions as the curved surface fitting device. Here, the CPU 3 corresponds to the calculation unit in the present disclosure. The CPU 3 as the calculation unit includes a control point setting unit 31, a deformation target point setting unit 32, a movement amount determination unit 33, and an FFD execution unit 34 as illustrated in FIG. 17.

Curved Surface Fitting Method

Figure 3:
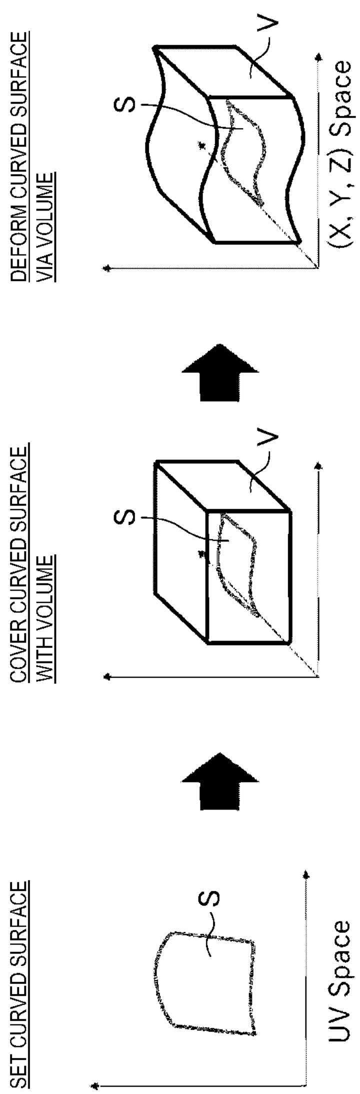
FIG. 3 is a diagram for describing the basic concept of FFD.
Figure 4:
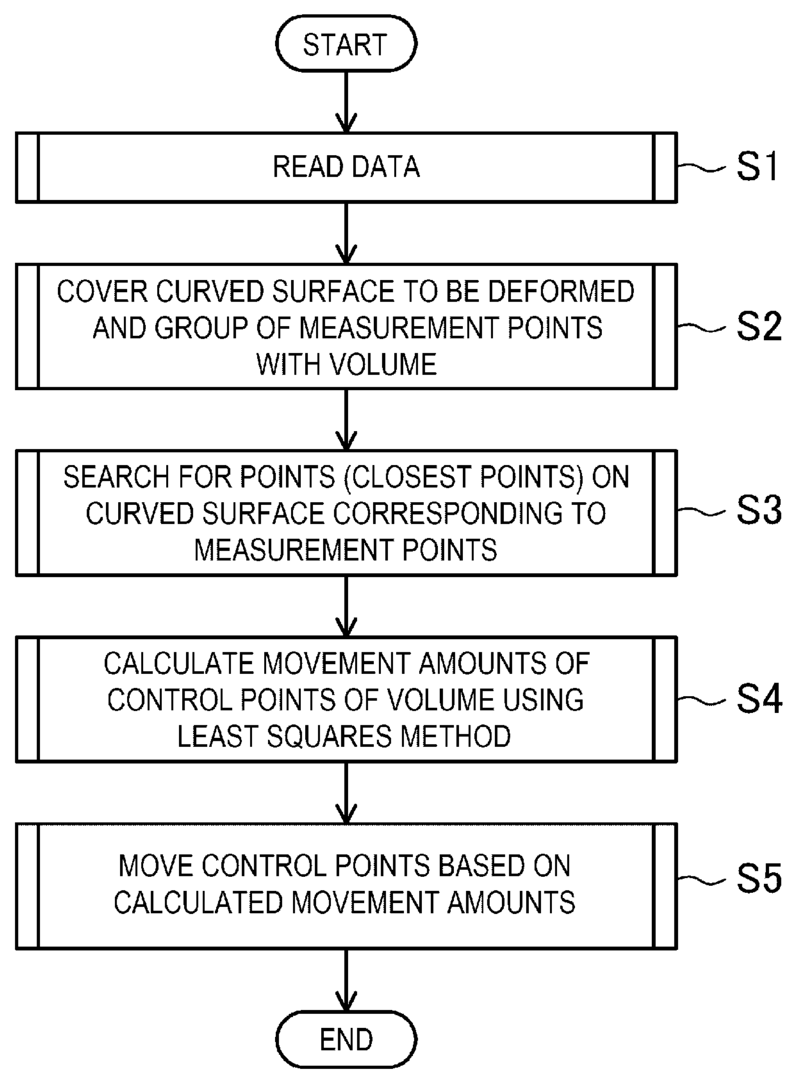
FIG. 4 is a flowchart illustrating the basic procedure of a curved surface fitting method.
Figure 5:
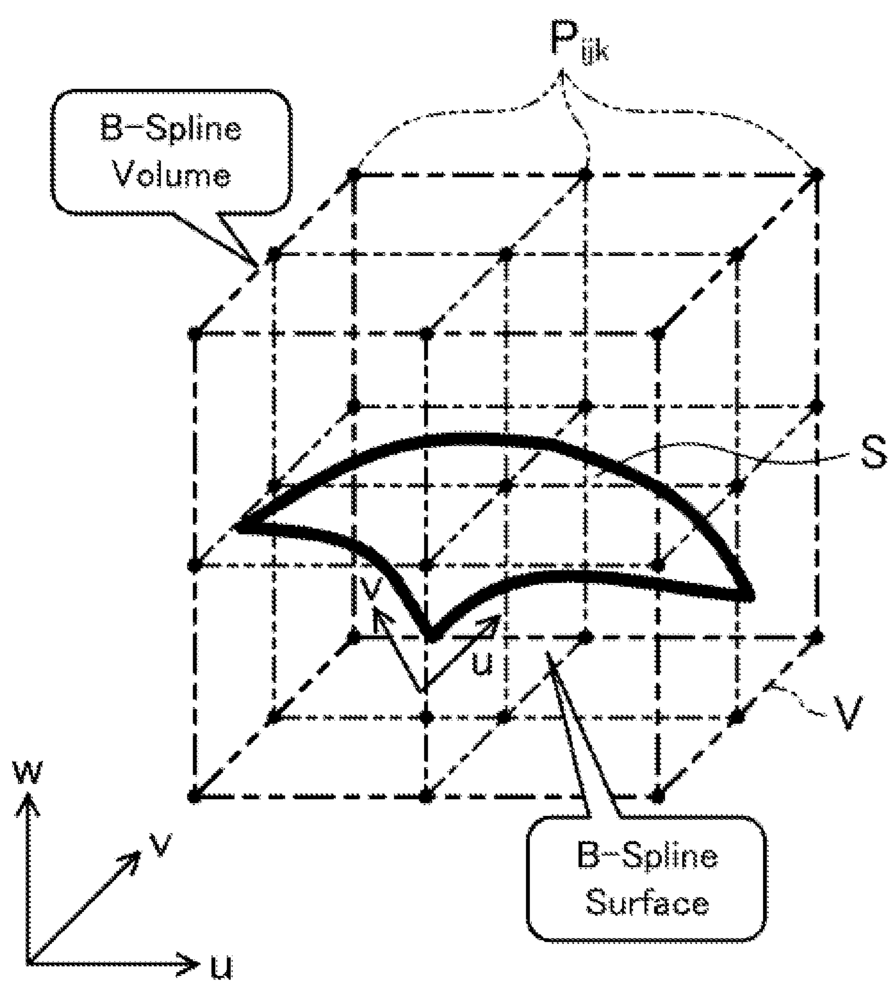
FIG. 5 is a diagram for describing the process of covering a curved surface model with a volume.
Figure 6:
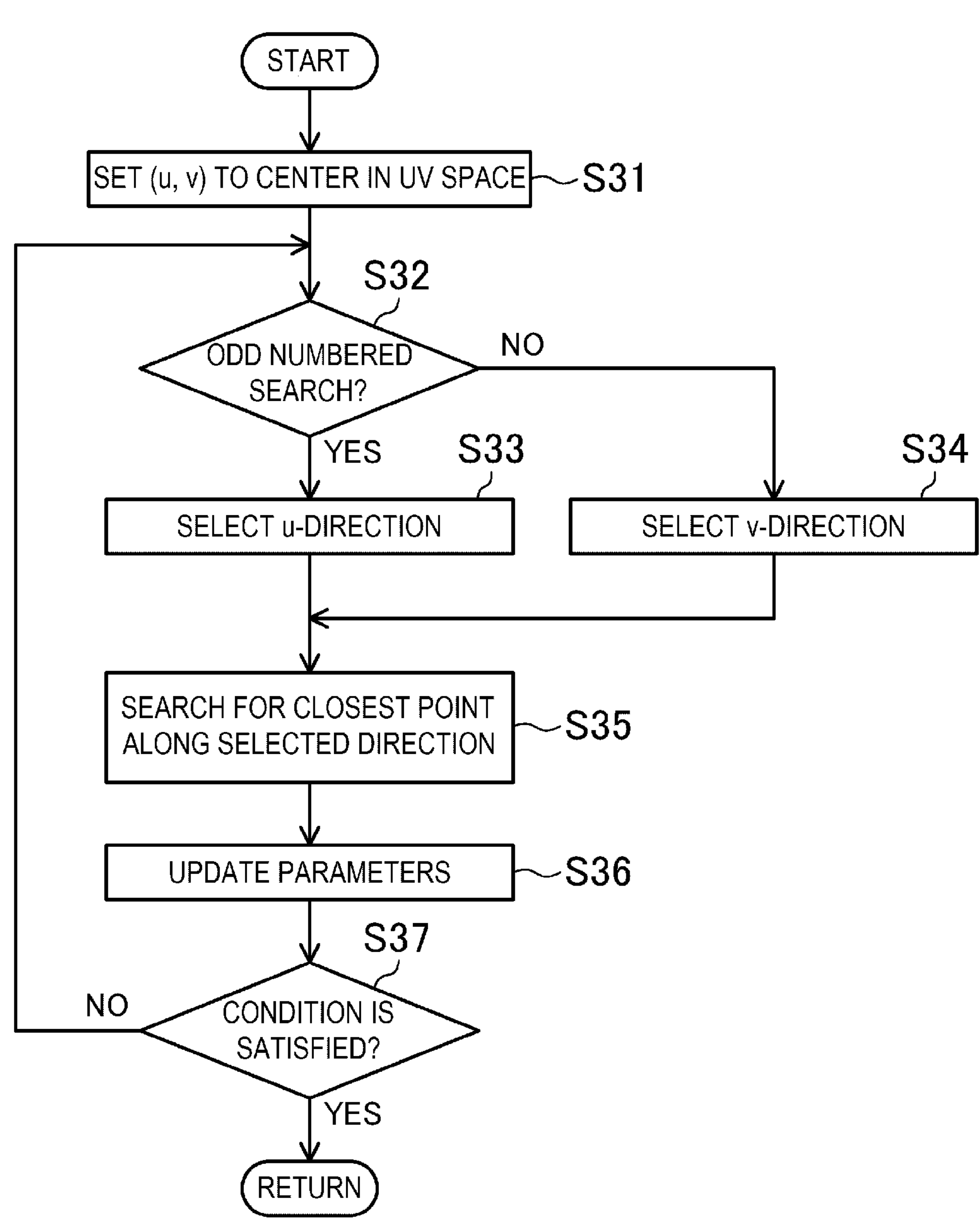
FIG. 6 is a flowchart illustrating the search procedure of a closest point.
Figure 7:
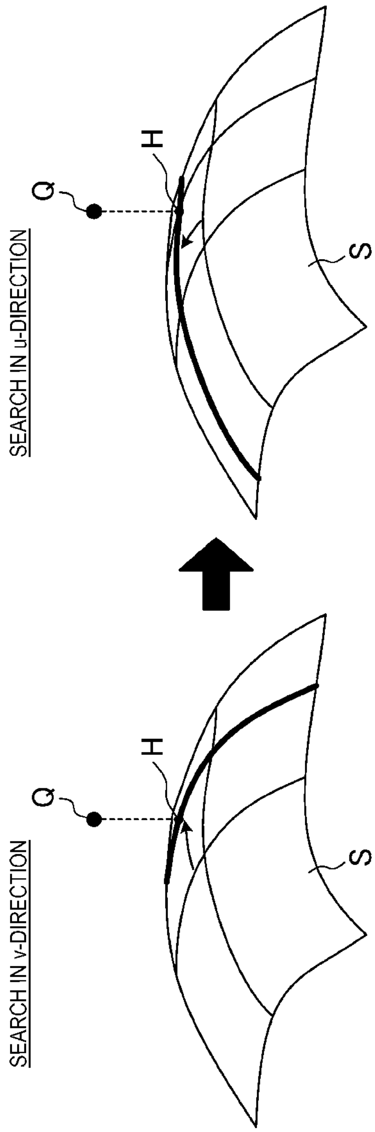
FIG. 7 is a diagram for describing the search procedure of the closest point.

FIG. 3 is a diagram for describing the basic concept of FFD, FIG. 4 is a flowchart illustrating the basic procedure of a curved surface fitting method, and FIG. 5 is a diagram for describing the process of covering the curved surface model S with a volume V. In addition, FIG. 6 is a flowchart illustrating the search procedure of a closest point H, and FIG. 7 is a diagram for describing the search procedure of the closest point H.

In the fitting procedure illustrated in FIG. 4, the computer 1 fits the curved surface model S set in a three-dimensional space to a plurality of object points (measurement points Q) set in the three-dimensional space by executing free-form deformation (FFD).

Here, the FFD first sets the curved surface model S to be deformed. Next, the FFD sets the volume V having many control points and covers the curved surface model S with the volume V. Then, the FFD deforms the volume V in which the control points are defined and therefore the coordinate system by moving the control points. The curved surface model S covered with the volume V also deforms as the coordinate system deforms (see FIG. 3).

In addition, the deformation of the curved surface model S by the FFD is performed by use of a parameter space instead of a global coordinate system. In particular, in the embodiment, the deformation of the curved surface model S is performed through a two-parameter free-form surface. In the following, the case using a B-Spline surface as an example of such a free-form surface will be described.

Specifically, a B-Spline surface can be defined by equation (1) below.

Equation (1)

$$S(u, v) = \sum_{i=0}^{n}\sum_{j=0}^{m} N_i^n(u) N_j^m(v) P_{ij} \tag{1}$$

Equation (2)

$$N_i^n(u) = \frac{u - t_i}{t_{i+n} - t_i} N_i^{n-1}(u) + \frac{t_{i+n+1} - u}{t_{i+n+1} - t_{i+1}} N_{i+1}^{n-1}(u) \tag{2}$$

$$N_i^0(u) = \begin{cases} 1 & u \in [t_i, t_{i+1}) \\ 0 & u \notin [t_i, t_{i+1}) \end{cases}$$

Equation (1) parametrically represents the coordinates on the curved surface model S. In equation (1), (u, v) are variables when a B-Spline surface is parametrically represented and defines a parameter space (UV space). In addition, "n" is the order of the B-Spline surface in the u-direction and "m" is the order of the B-Spline surface in the v-direction. In addition, as illustrated in equation (2), "N" is a so-called B-Spline basis function. That is, "t" in equation (2) is a so-called knot sequence. In addition, the upper superscripts n and m in the equation (2) indicate the orders of the B-Spline surface in the u direction and the v direction, respectively. In addition, $P_{ij}$ indicates the control point i-th arranged in the u-direction and j-th arranged in the v-direction.

Basic Concept of the Fitting Method

The steps in FIG. 4 will be described in sequence below.

—Step S1—

In the first step S1, the computer 1 reads the model data 49 and the measurement data 59 stored in the program memory. The model data 49 and the measurement data 59 are set in the three-dimensional space as described above and includes the curved surface model S to be deformed by the FFD and a plurality of measurement points Q that are the deformation objects of this curved surface model S.

Of these, the curved surface model S represented as the B-Spline surface that is parametrically represented using the two parameters u and v as described above and developed by the B-Spline basis function. The shape of the curved surface model S can be characterized by the coordinates of the control points $P_{ij}$ and the knot sequence that defines the shape of the B-Spline basis function.

—Step S2—

In the subsequent step S2, the control point setting unit 31 covers at least part of the plurality of measurement points Qs and the curved surface model S with the volume V and sets a plurality of control points $P_{ijk}$ within the volume V. As illustrated in equation (3) below, the volume V can be developed by the B-Spline basis function as in the curved surface model S.

Equation (3)

$$V(u, v, w) = \sum_{i=0}^{l}\sum_{j=0}^{m}\sum_{k=0}^{n} N_i(u) N_j(v) N_k(w) P_{ijk} \tag{3}$$

Since the B-Spline volume V (simply referred to below as "the volume V") defined by equation (3) above has a three-dimensional shape instead of a curved surface, three variables (u, v, w) are used.

Here, it is necessary to use a B-Spline basis function of the third order or higher in all of the u-direction, the v-direction, and the w-direction to ensure the curvature continuity. In the embodiment, a case using a cubic B-Spline basis function.

In addition, in equation (3) above, $P_{ijk}$ indicates the control point i-th arranged in the u-direction, j-th arranged in the v-direction, and k-th arranged in the w-direction. The shape of the volume V can be characterized by the coordinates of the control points $P_{ijk}$ and the knot sequence that defines the shape of the B-Spline basis function.

Here, the plurality of control points $P_{ijk}$ may be set so as to surround at least part of the curved surface model S. In that case, the volume V covers at least part of the curved surface model S. In particular, in the embodiment, the volume V and the control points $P_{ijk}$ are set so as to cover all of the plurality of measurement points Q and the curved surface model S while the control points $P_{ijk}$ are evenly spaced so as to form a simple cubic lattice (see FIG. 5).

When the setting of the volume V and the control points $P_{ijk}$ is completed, the processing proceeds from step S2 to step S3. Step S2 illustrated here is an example of the "control point setting process" in the embodiment.

—Step S3—

In the subsequent step S3, the deformation target point setting unit 32 sets a plurality of deformation target points corresponding to the plurality of measurement points Q on the curved surface model S. In the embodiment, the deformation target points are set as the closest points H with respect to the measurement points Q on the curved surface model S.

For example, the closest point H with respect to a certain measurement point Q on the curve C can be calculated as follows. That is, as illustrated in equation (4) below, when the line segment connecting point P to the point on the curve C is orthogonal to the curve C, point P is closest to the point on the curve C.

Equation (4)

$$C'(u)\cdot(P-C(u))=0 \tag{4}$$

Accordingly, the closest point H on the curved surface model S can be found for each of the measurement points Q by performing a search using equation (4) above for both the u-direction and the v-direction. The flowchart in FIG. 6 specifically illustrates this processing. First, in step S31 in FIG. 6, the deformation target point setting unit 32 sets the values of the parameters (u, v) of the curved surface model S to the center in the parameter space (UV space).

In the subsequent step S32, the deformation target point setting unit 32 determines whether the search is an odd numbered search. The deformation target point setting unit 32 selects the u-direction when this determination is YES or selects the v-direction when the determination in step S32 is NO.

In the subsequent step S33, the deformation target point setting unit 32 fixes the direction selected in step S32 and changes the unselected direction on the curved surface model S. Then, the deformation target point setting unit 32 finds the parameters that are closest to the measurement points Q. The processing regarding step S33 is executed using equation (4) above. It should be noted that the dichotomy method, the Newton method, or the like can be used when equation (4) above is calculated numerically.

In the subsequent step S34, the deformation target point setting unit 32 updates the coordinates of the closest point H by substituting the parameters found in step S33 into the coordinates of the closest point H.

In the subsequent step S35, the deformation target point setting unit 32 determines whether the coordinates of the closest point H updated in step S34 satisfy predetermined conditions. When the determination result is YES, the deformation target point setting unit 32 ends the flow. When the determination result is NO, the deformation target point setting unit 32 increments the number of searches by one and returns to step S32.

It should be noted that the predetermined conditions in step S35 include the amount of change in the parameters (u, v) during a search and/or whether the distance between the closest point H and the measurement point Q is less than a predetermined threshold. In addition to this or instead of this, the number of searches for the closest point H may be set to the threshold so as to determine whether the number of searches exceeds the threshold.

For example, as illustrated in FIG. 7, at the time of the first search, the value of parameter v closest to the measurement point Q is searched for while the u-direction is fixed and the v-direction is changed. The coordinates of the closest point H are updated with the value of v searched for as described above, and it is determined whether the updated coordinates satisfy the predetermined conditions. When the updated coordinates do not satisfy the predetermined conditions, the value of the parameter u that is closest to the measurement point Q is searched for while the v-direction is fixed and the u-direction is changed. The coordinates of the closest point H are updated with the value of u searched for as described above and it is determined again whether the updated coordinates satisfy the predetermined conditions.

These processes are repeatedly executed and the coordinates of the final closest point H are set to the values of the parameters (u, v) when the predetermined conditions are satisfied.

In addition, the processing illustrated in FIG. 6 is executed on all the measurement points Q covered with the volume V. For example, when the number of measurement points Q is N, the coordinates of the closest point H are searched for each of the N measurement points Q.

The coordinates of the p-th closest point H among the N closest points H are represented as $(u_p, v_p)$. In the following description, the coordinates of the measurement point Q corresponding to this closest point H may be particularly represented as $Q(u_p, v_p)$.

It should be noted that, when the measurement point Q and the closest point H corresponding to the measurement point Q are far apart from each other, fitting by the least squares method described later is inappropriate, so the measurement point Q needs to be removed. Accordingly, the curved surface fitting method according to the embodiment has the process of removing the measurement point Q from the target of fitting when the distance between the measurement point Q and the closest point H exceeds the predetermined threshold.

After the processing illustrated in FIG. 6 is executed on all the measurement points Q, the flow regarding FIG. 6 ends and the process proceeds from step S3 to step S4 in FIG. 4. Step S3 illustrated here is an example of the "deformation target point setting process" in the embodiment.

—Step S4—

It should be noted that the control points $P_{ijk}$ of the volume V are referred to as "$R_{ijk}$" to prevent confusion with the control points $P_{ij}$ of the curved surface model S.

In the subsequent step S4 continued from step S3, the movement amount determination unit 33 executes the least squares method so as to minimize the total value obtained by adding up the squares of the distances between the deformation target points (closest points H) contained in the volume V and the measurement points Q corresponding to the closest points H. The CPU 3 determines the movement amounts $\Delta R_{ijk}$ of the plurality of control points $R_{ijk}$ in FFD by executing the least squares method.

When the FFD is used, the curved surface model S is deformed via this volume V by moving the control points $R_{ijk}$ of the volume V. In contrast, the shape of the curved surface model S is characterized by the control points $P_{ij}$.

Accordingly, the correspondence between the control points $R_{ijk}$ of the volume V and the control points $P_{ij}$ of the curved surface model S is required to deform the curved surface model S by the FFD. Here, when the control points $P_{ij}$ of the curved surface model S are represented as P(I, J) to prevent confusion with the subscripts of the control points $R_{ijk}$ of the volume V, the control points P(I, J) can be developed using the control points $R_{ijk}$ of the volume V as in equation (3).

Equation (5)

$$P(I, J) = \sum_{i=0}^{l}\sum_{j=0}^{m}\sum_{k=0}^{n} N_i(s_{IJ})N_j(t_{IJ})N_k(w_{IJ})R_{ijk} \tag{5}$$

Parameters (s, t, w) can be determined by I and J. By disposing the control points $R_{ijk}$ of the volume V in a grid pattern as described above, the correspondence between the two parameters (I, J) of the curved surface model S and the three parameters (s, t, w) of the volume V can be easily calculated.

Then, by replacing n and m of equation (1) with L and M, respectively, and then substituting equation (5) into equation (1), the curved surface model S can be represented as equation (6) below.

Equation (6)

$$S(u, v) = \sum_{i=0}^{L}\sum_{j=0}^{M} N_i(u)N_J(v)\sum_{l=0}^{l}\sum_{j=0}^{m}\sum_{k=0}^{n} N_i(s_{IJ})N_j(t_{IJ})N_k(w_{IJ})R_{ij} \tag{6}$$

The cost function as the equation (7) below can be defined using this.

Equation (7)

$$F(\Delta R_{ijk}) = \left. N_I(u_p)N_j(v_p)\sum_{l=0}^{l}\sum_{j=0}^{m}\sum_{k=0}^{n} N_i(s_{IJ})N_j(t_{IJ})N_k(w_{IJ})(R_{ijk} + \Delta R_{ijk} - Q(u_p, v_p)\right\}^2 \tag{7}$$

Here, the first term in parentheses in equation (7) represents the coordinates of the p-th closest point H when the control points $R_{ijk}$ of the volume V are moved by specified movement amounts $\Delta R_{ijk}$. On the other hand, the second term in parentheses in equation (7) represents the coordinates of the measurement point Q corresponding to this closest point H.

That is, the cost function F indicates the sum (the total value obtained by adding up the squares of the distances) of squares of the distances between the closest points H and the measurement points Q when the control points $R_{ijk}$ are moved by predetermined movement amounts $\Delta R_{ijk}$. Accordingly, the cost function F can be regarded as the cost function in the least squares method and the sum of squares of the distances between the closest points H and the measurement points Q can be minimized by searching for the movement amounts $\Delta R_{ijk}$ that minimize the cost function F and moving the control points $R_{ijk}$ by the searched movement amounts $\Delta R_{ijk}$.

Specifically, the movement amount determination unit 33 obtains the movement amounts $\Delta R_{ijk}$ that minimize the cost function F by partially differentiates the cost function F by the movement amounts $\Delta R_{ijk}$ and setting the result to 0.

Here, the following equation is assumed for simple representation.

Equation (8)

$$R'_{ijk} = R_{ijk} + \Delta R_{ijk} \tag{8}$$

When the cost function F is partially differentiated by $R_{ijk}'$, the following equation is obtained.

Equation (9)

$$\frac{\partial F(R'_{ijk})}{\partial R'_{ijk}} = 2\sum_{p=1}^{N}\left\{\left\{\sum_{I=0}^{L}\sum_{J=0}^{M}(u_p)N_J(v_p)\sum_{i=0}^{l}\sum_{j=0}^{m}\sum_{k=0}^{n} N_i(s_{IJ})N_j(t_{IJ})N_k w_{IJ} R'_{ijk} - Q(u_p, v_p)\right\}\left\{\sum_{l=0}^{L}\sum_{j=0}^{M} N_I(u_p)N_J(v_p)N_i(s_{IJ})N_j(t_{IJ})N_k w_{IJ}\right\}\right\} \tag{9}$$

When the left side of equation (9) is set to 0, equation (10) below is obtained.

Equation (10)

$$\sum_{p=1}^{N}\left\{\left\{\sum_{l=0}^{L}\sum_{j=0}^{M} N_I(u_p)N_J(v_p)\sum_{l=0}^{l}\sum_{j=0}^{m}\sum_{k=0}^{n} N_i(s_{IJ})N_j(t_{IJ})N_k(w_{IJ})R'_{ijk}\right\}\left\{\sum_{l=0}^{L}\sum_{j=0}^{M} N_I(u_p)N_J(v_p)N_i(s_{IJ})N_j(t_{IJ})N_k(w_{IJ})\right\}\right\} = \sum_{p=1}^{N}\left\{Q(u_p, v_p)\left\{\sum_{l=0}^{L}\sum_{j=0}^{M} N_I(u_p)N_J(v_p)N_i(s_{IJ})N_j(t_{IJ})N_k(w_{IJ})\right\}\right\} \tag{10}$$

When equation (10) is described in a matrix form, equation (11) below is obtained.

Equation (11)

$$AR'_{ijk} = b \tag{11}$$

In equation (11), the matrix A is a (i×j×k)-order square matrix. The individual elements of the matrix A are illustrated by equations (12) to (14) below.

Equation (12)

$$A(r(ri, rj, rk), c(ci, cj, ck)) = \left.\sum_{l=0}^{L}\sum_{j=0}^{M} N_I(u_p)N_J(v_p)N_{ci}(s_{IJ})N_{cj}(t_{IJ})N_{ck}(w_{IJ})\right\}\left\{\sum_{l=0}^{L}\sum_{j=0}^{M} N_i(u_p)N_J(v_p)N_{ri}(s_{IJ})N_{ri}(t_{IJ})(w_{IJ})\right\} \tag{12}$$

Equation (13)

$$r(ri, rj, rk) = (ri \times m \times n) + (rj \times n) + rk \tag{13}$$

Equation (14)

$$c(ci, cj, ck) = (ci \times m \times n) + (cj \times n) + ck \tag{14}$$

By solving equation (11) for $R_{ijk}'$, it is possible to obtain $R_{ijk}'$ that minimizes the cost function F and therefore the movement amount $\Delta R_{ijk}$. For example, the LU decomposition method can be used as the solution of equation (11). The movement amount determination unit 33 calculates the movement amounts $\Delta R_{ijk}$ through numerical calculation using the LU decomposition method or the like.

When the calculation of the movement amounts $\Delta R_{ijk}$ is completed, the processing proceeds from step S4 to step S5 in FIG. 4. Step S4 illustrated here is an example of the "movement amount determination process" in the embodiment.

—Step S5—

In the subsequent step S5 continued from step S4, the FFD execution unit 34 fits the curved surface model S to the plurality of measurement points Q by performing FFD based on the movement amounts $\Delta R_{ijk}$ calculated in step S4.

Specifically, the FFD execution unit 34 moves the control points $R_{ijk}$ to updates the control points $R_{ijk}$ to new control points $R_{ijk}+\Delta R_{ijk}$. This deforms the volume V based on equation (3). Then, the curved surface model S is deformed based on the formula (1) while the control point P(I, J) of the curved surface model S is updated based on formula (5), and the flow illustrated in FIG. 4 ends.

It should be noted that step S5 illustrated here is an example of the "FFD execution process" in the embodiment.

As described above, according to the embodiment, the movement amounts $\Delta R_{ijk}$ of the control points $R_{ijk}$ of the FFD can be determined by the least squares method that uses the sum of squares of the distances between the closest points H as the deformation target points and the measurement points Q corresponding to the closest points H. This can systematically determine the movement amounts $\Delta R_{ijk}$ of the control points while clarifying the theoretical evidence.

In addition, by using the plurality of measurement points Qs that indicate the surface shape of the metal mole as the plurality of object points, the movement amounts $\Delta R_{ijk}$ of the control points $R_{ijk}$ can be calculated appropriately even when the measurement points Q that may contain noise or the like are the object points.

Structure Related to the Multi-Stage Deformation

Figure 8:
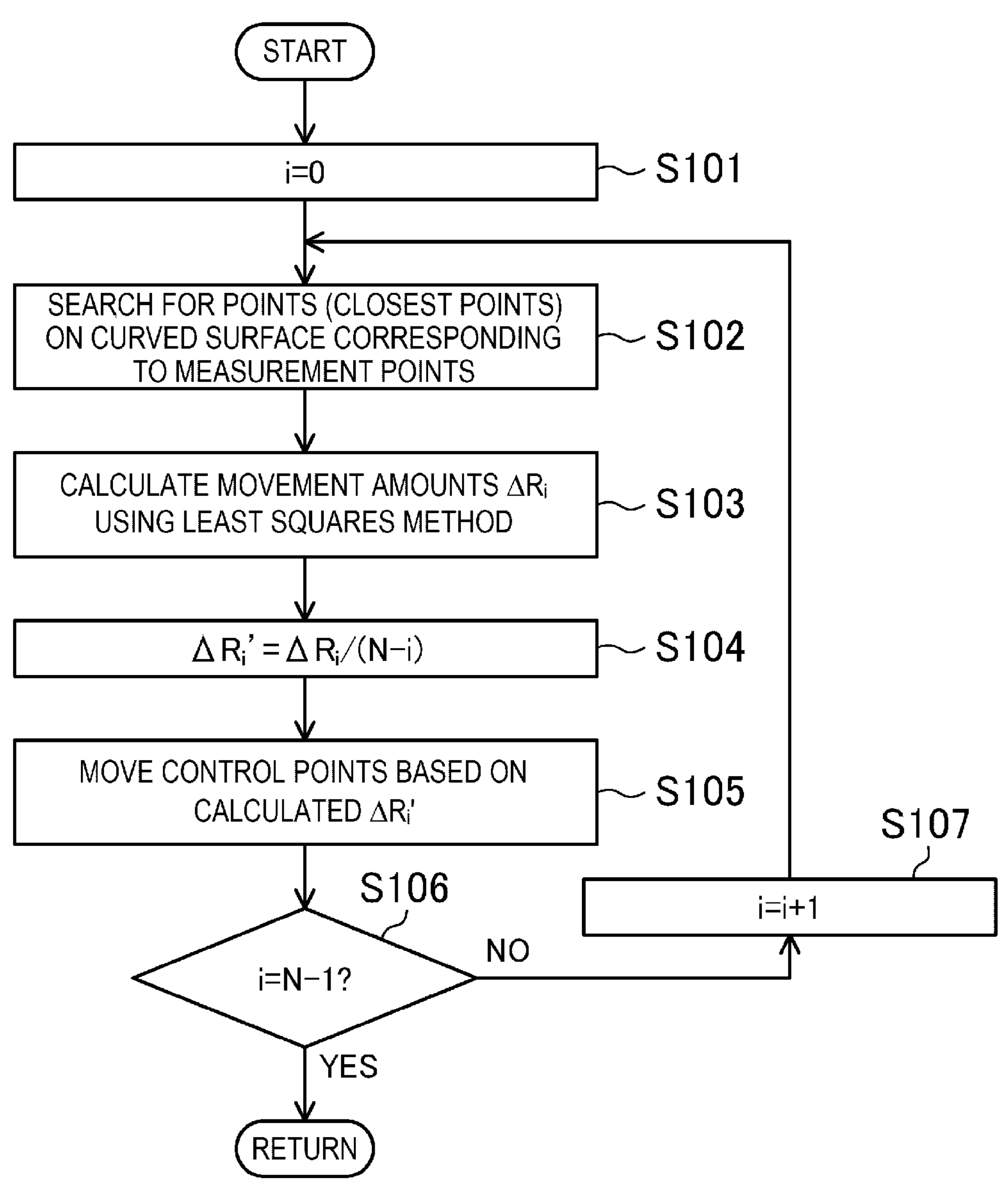
FIG. 8 is a flowchart illustrating the procedure of multi-stage deformation in FFD.
Figure 9:
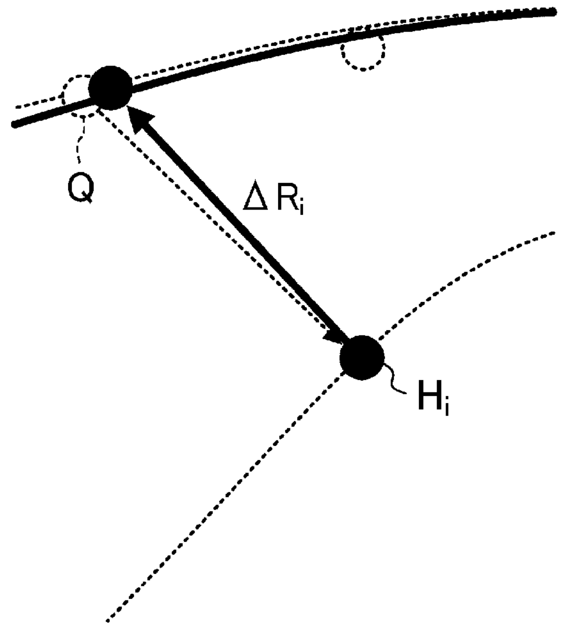
FIG. 9 is a diagram for explaining the procedure of multi-stage deformation in FFD.
Figure 9:
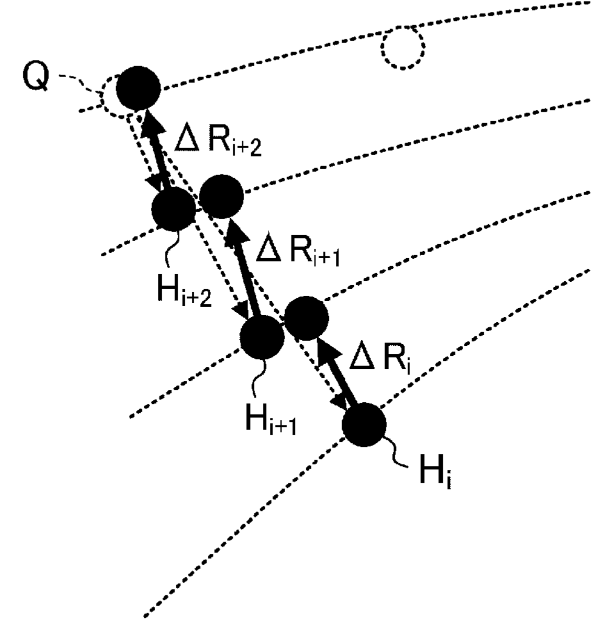

FIG. 8 is a flowchart illustrating the procedure of multi-stage deformation in the FFD and FIG. 9 is a diagram for describing the procedure of the multi-stage deformation in the FFD.

When the curved surface model S and the measurement points Q are relatively far apart from each other, the flow illustrated in FIG. 4 may be insufficient. That is, when the FFD by the least squares method is used, whether the curved surface model S and the measurement points Q are sufficiently close to each other depends on the search accuracy of the closest points H as the deformation target points. When the curved surface model S and the measurement points Q are relatively far apart from each other, the parameters obtained as the closest points H may not be optimal. Accordingly, the deformation with higher accuracy can be performed by repeating the deformation by the FFD a plurality of times and searching for the closest point H for each of the repetitions.

Specifically, the computer 1 as the curved surface fitting device repeatedly performs the FFD a plurality of times by dividing the movement amounts $\Delta R_{ijk}$ determined in step S4 (movement amount determination process) and performing step S5 (FFD execution process) above based on the divided movement amounts $\Delta R_{ijk}$.

FIG. 8 is a flowchart illustrating the procedure of such multi-stage deformation. In FIG. 8, "N" represents the number of repetitions of the FFD. This number of repetitions N is preset and stored in the RAM 7, the HDD 9, or the like.

First, although omitted in FIG. 8, the computer 1 reads model data 49 and sets the volume V as in steps S1 to S2 in FIG. 4. At this time, the computer 1 also reads the number of repetitions N of the FFD.

Subsequently, the CPU 3 sets the variable i to zero as illustrated in step S101 in FIG. 8. The variable i represents the number of repetitions at that time.

In the subsequent step S102, the deformation target point setting unit 32 searches for the closest points $H_i$ on the curved surface model S that correspond to the measurement points Q. Here, the subscript i of the closest point $H_i$ represents the number of repetitions i. Specifically, in this step S102, the same processing as in step S3 in FIG. 4, that is, the processing described with reference to FIG. 6 is executed. When i=0, that is, the closest point $H_0$ found during the first search matches the closest point H obtained in step S3 in FIG. 4.

In the subsequent step S103, the movement amount determination unit 33 obtains the movement amounts $\Delta R_i$ of the control points by the least squares method based on the closest points $H_i$ found in step S102. The subscript i of the movement amount $\Delta R_i$ represents the number of repetitions i as in the closest point $H_i$. Specifically, in step S103, the same processing as in step S4 in FIG. 4 is executed.

In the subsequent step S104, the movement amount determination unit 33 divides the movement amounts $\Delta R_i$ obtained in step S103 and calculates new movement amounts $\Delta R_i'$. Specifically, the movement amounts $\Delta R_i'$ are obtained by equation (15) below.

Equation (15)

$$\Delta R_i' = \frac{1}{N-i}\Delta R_i \tag{15}$$

In the subsequent step S105, the FFD execution unit 34 moves the control points R of the volume V and therefore the control points P(I, J) of the curved surface model S based on the new movement amounts $\Delta R_i'$ obtained in step S104.

In the subsequent step S106, the CPU 3 determines whether the number of repetitions i has reached N−1, that is, whether steps S102 to S105 have been repeated N times. When this determination is YES, the deformation by the FFD ends.

In contrast, when the determination in step S106 is NO, the number of repetitions i is incremented by one in step S107 and then the processing returns to step S102. After returning to step S102, the closest points $H_{i+1}$ are searched for on the curved surface model S after deformation is performed based on the new movement amounts $\Delta R_i'$. By repeating these steps recursively, the closest points $H_i$, $H_{i+1}$, and $H_{i+2}$ gradually approach the measurement points Q (see FIG. 9).

As can be seen from equation (15) above, when the number of repetitions i is relatively small, the new movement amount $\Delta R_i'$ is sufficiently smaller than the original movement amount $\Delta R_i$. In contrast, as the number of repetitions i becomes larger, the new movement amount $\Delta R_i'$ becomes closer to the original movement amount $\Delta R_i$. In particular, when the number of repetitions i reaches N−1, the new movement amount $\Delta R_i'$ matches the original movement amount $\Delta R_i$.

By deforming the curved surface model S at multiple stages as described above, the spread of the curved surface can be suppressed and more accurate deformation can be achieved.

Structure Related to a Specific Curved Surface Model

Structure Related to a Trimmed Surface

Figure 10:
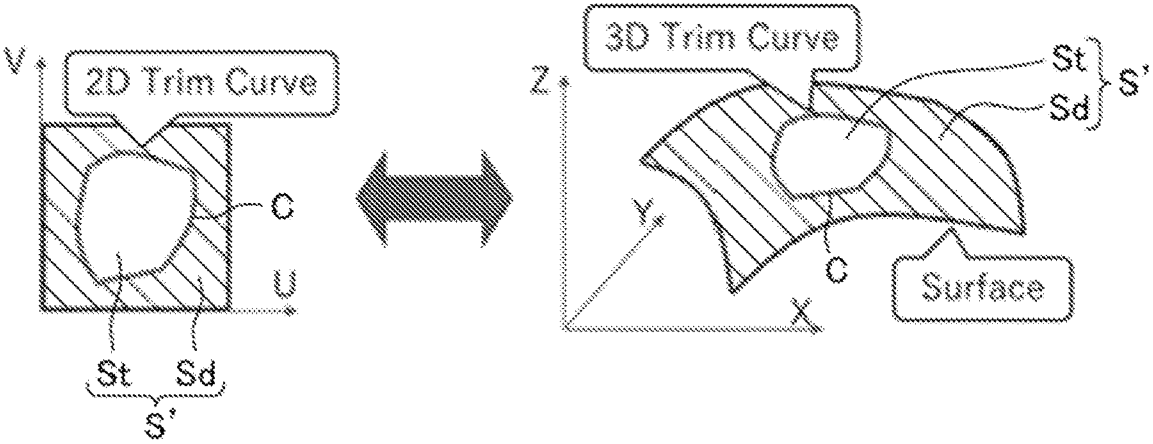
FIG. 10 is a diagram illustrating a curved surface model including a trimmed surface.

FIG. 10 is a diagram illustrating the curved surface model S including a trimmed surface St.

As described above, a three-dimensional curved surface that models a metal mold can be used as the curved surface model S and a plurality of measurement points Q that represent the surface shape of the metal mold can be used as a plurality of object points. Here, in the case of a metal mold having a complicated and fine shape such as a metal mold for an automobile outer panel component, the metal mold may be modeled as a curved surface in which so-called trimmed surfaces are combined instead of a single curved surface as illustrated in FIG. 3 and the like.

That is, as illustrated in FIG. 10, a combination of a curved surface Sd that partitions the domain of a curved surface model S' and the trimmed surface St obtained by trimming the curved surface Sd may be fitted as the curved surface model S'.

However, when the movement amounts $\Delta R_{ijk}$ of the control points $R_{ijk}$ of the volume V are determined using only the control points P(I, J) of the curved surface model S as the movement targets, the control points of the trimmed surface St cannot be moved.

Accordingly, the computer 1 according to the embodiment is configured to perform fitting by FFD on the boundary C between the curved surface Sd that constitutes the curved surface model S' and the trimmed surface St in addition to the curved surface Sd.

Specifically, the curved surface Sd is fitted as in the curved surface model S described above. On the other hand, it is sufficient that the boundary C between the curved surface Sd and the trimmed surface St is defined as a closed loop (see FIG. 10) in a UV space and then FFD by the least squares method is executed on the closed loop.

More specifically, first, based on the trimmed surface St in the UV space, sampled points are disposed at appropriate intervals on the curved surface Sd so as to follow the boundary C between the trimmed surface St and the curved surface Sd. Steps S2 (control point setting process), step S3 (deformation target point setting process), step S4 (movement amount determination process), and step S5 (FFD execution process) described above are performed on the sampled points disposed in this way, whereby the boundary C can be deformed by FFD. Then, the trimmed surface St can also be indirectly fitted by reflecting the deformation result of the boundary C on the deformation result of the curved surface Sd.

As described above, by using the execution result of FFD on the boundary C defined as a closed loop together with the deformation result of the curved surface Sd, it is possible to fit the curved surface model S while maintaining the continuity of the boundary C between the curved surface Sd and the trimmed surface St, the continuity of tangent plane between the curved surface Sd and the trimmed surface St, and the continuity of the curvature between the curved surface Sd and the trimmed surface St.

Figure 11:
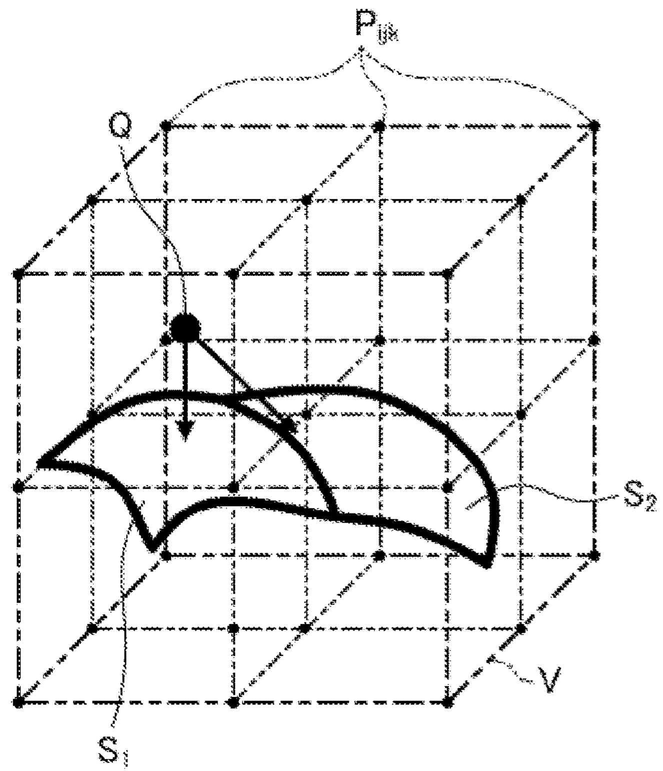
FIG. 11 is a diagram illustrating a curved surface model including a plurality of curved surfaces.

Structure Related to the Trimmed Surface Including a Plurality of Curved Surfaces FIG. 11 is a diagram illustrating a curved surface model including the plurality of curved surfaces $S_1$ and $S_2$.

In general, when a model of a metal mold or the like includes a plurality of curved surfaces, it is desirable to deform the curved surfaces at the same time while maintaining the connection relationship between the curved surfaces. As illustrated in FIG. 11, the curved surface fitting method according to the embodiment can deform a plurality of curved surfaces at the same time.

That is, the curved surface model S includes a combination of the curved surfaces $S_1$, $S_2$, . . . set in a three-dimensional space, and the computer 1 as the curved surface fitting device can execute step S2 (control point setting process), step S3 (deformation target point setting process), step S4 (movement amount determination process), and step S5 (FFD execution process) described above so as to deform the plurality of curved surfaces $S_1$, $S_2$, . . . at the same time.

Basically, the same processing as when there is one curved surface is executed. However, when there are a plurality of curved surfaces, the processing for selecting a curved surface to be deformed is required for each of the measurement points Q. Specifically, the computer 1 calculates the distances between each of the measurement points Q and all the curved surfaces $S_1$, $S_2$, . . . before and after step S3 and selects the curved surface for which the calculated distance is the shortest. As described above, the computer 1 executes the process of associating the curved surface having the shortest distance and therefore the closest point H for each of the measurement points Q.

Then, when the least squares method is executed based on equation (11) or the like, the sum of squares of the distance from the corresponding curved surface is added up for each of the measurement points Q. By appropriately selecting the corresponding curved surface for each of the measurement points Q, it is possible to fit the curved surface model S, which includes a combination of the curved surfaces.

For example, in the example illustrated in FIG. 11, the distance between the measurement point Q and the curved surface S1 and the distance between the measurement point Q and the curved surface S2 are calculated in sequence, and fitting using FFD can be performed even in the curved surface model S including a plurality of curved surfaces so that the curved surface S1 having a relatively short distance is selected.

Structure Related to Extrapolation of a Free-Form Surface

Figure 12:
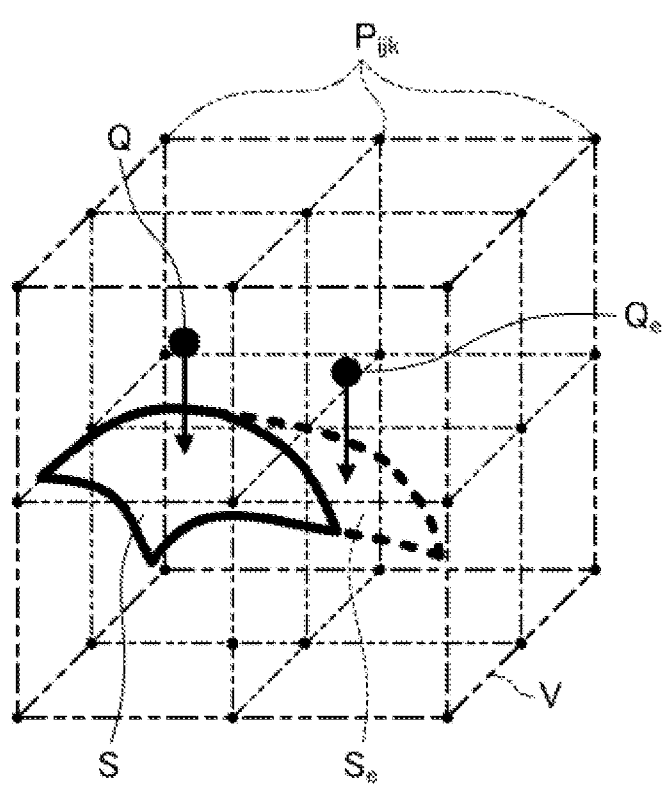
FIG. 12 is a diagram for describing a structure in which a curved surface is extrapolated to a curved surface model.

FIG. 12 is a diagram for describing a structure in which a curved surface $S_e$ is extrapolated to the curved surface model S.

In general, the curved surface obtained by fitting may undulate unnaturally in a place that is sufficiently close to the measurement points Q, but is apart from the measurement points Q (particularly near the boundary of the curved surface). Such a situation can occur when, for example, the curved surface model S has a complicated shape or when many measurement points Q are disposed. This is inconvenient for application to a metal mold having a complex and fine shape, such as a metal mold for the outer panel component of a vehicle.

Accordingly, as illustrated in FIG. 12, the curved surface fitting method according to the embodiment can extrapolate the curved surface $S_e$ to the curved surface model S and set the closest point H that serves as the deformation target point on the extrapolated curved surface (referred to below as "extrapolation surface" denoted by "$S_e$"). In addition, a measurement point $Q_e$ can be virtually added as needed so as to correspond to the extrapolation surface Sc. Such a process is added, for example, before or after step S1 in FIG. 4.

Here, the extrapolation surface $S_e$ may have any shape. The extrapolation surface $S_e$ may be, for example, a tangent plane extending from the end of the curved surface model S.

In addition, the accuracy of the measurement point $Q_e$ to be added does not need to be considered particularly.

This structure can achieve smoother fitting by suppressing undulation near the boundary of the curved surface.

Specific Example of the Curved Surface Fitting Method

In general, since manual work by a craftsman may often intervene in the production of the metal mold of the outer panel component, the efficiency needs to be improved. In particular, when the metal mold degrades and the same the metal mold is manufactured again, it is inefficient to do the same manual work as in the first production. Accordingly, the efficiency of the second and subsequent manual work by the craftsman can be improved by three-dimensionally measuring the so-called first metal mold and feeding back the measurement results to a CAD system.

Here, in the feedback to the CAD system, the effects of the manual work by the craftsman need to be reflected on, for example, the three-dimensional CAD data used at the time of the production of a new metal mold. Accordingly, after the measurement results of the actual metal mold are assumed to be the measurement point Q and the three-dimensional CAD data before feedback is assumed to be the curved surface model S, the FFD method using the least square method, that is, the curved surface fitting method according to the embodiment is applied. This can determine the movement amount of the control point in FFD systematically and fit the three-dimensional CAD data to the measurement point Q.

As described above, the curved surface fitting method according to the embodiment can be used for so-called reverse engineering. Since the metal mold for the outer panel component of an automobile has a complicated and fine shape, the curved surface model obtained based on the metal mold may include a plurality of trimmed surfaces or a plurality of curved surfaces. As described above, the curved surface fitting method according to the embodiment can perform systematic fitting while clarifying the theoretical evidence even in such a curved surface model.

In particular, the conventional method of determining the movement amount of the control point cannot be concluded to have no theoretical evidence or the appropriate theoretical evidence. However, according to the embodiment, it is possible to automatically determine the movement amount without imposing a burden on the user even when the number of control points increases while clarifying the theoretical evidence.

A specific example of the curved surface fitting method will be described with reference to FIGS. 13 to 16. Here, FIG. 13 is a diagram illustrating a curved surface model Sb that models a bead shape, FIG. 14 is a diagram illustrating cross section A-A of the curved surface model Sb, FIG. 15 is a diagram illustrating the deformation result of the curved surface model Sb, and FIG. 16 is a diagram illustrating the result of application of the multi-stage deformation to the curved surface model Sb.

Figures 13, 14:
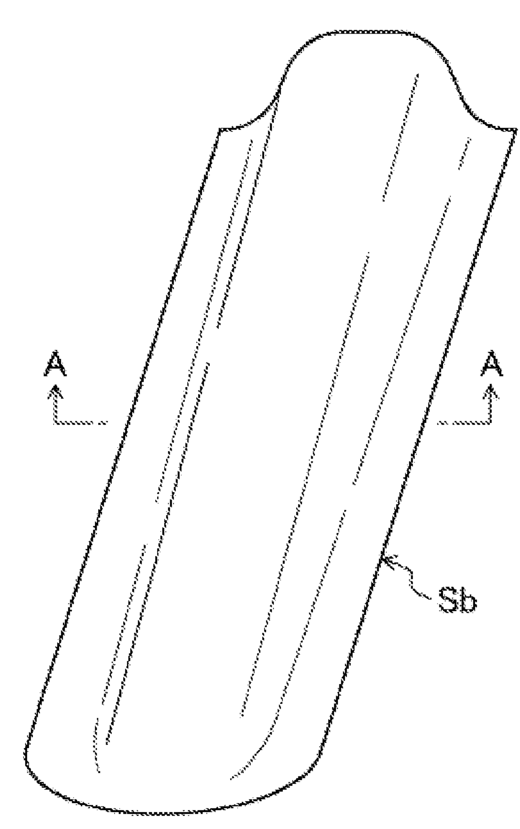
FIG. 13 is a diagram illustrating a curved surface model that models a bead shape.
FIG. 14 is a diagram illustrating cross section A-A of the curved surface model.

The curved surface model Sb illustrated in FIG. 13 models the bead shape of the metal mold used to manufacture the outer panel component and includes three-dimensional CAD data at the time of new production. On the other hand, the object points in FIG. 13 include the measurement points representing the surface shape of the actual metal mold after, for example, the manual work by the craftsman.

At least in the cross section illustrated in FIG. 14, the curved surface model Sb is divided into a first curved surface Sb1, a second curved surface Sb2, a third curved surface Sb3, a fourth curved surface Sb4, and a fifth curved surface Sb5 in the order from the left side in the sheet. In addition, a first extrapolation surface Sx1 is extrapolated from the first curved surface Sb1 toward the left side in the sheet and a second extrapolation surface Sx2 is extrapolated from the second curved surface Sb2 toward the right side of the sheet. Furthermore, the measurement point $Q_e$ is newly added along with the extrapolation of the first extrapolation surface Sx1 and the second extrapolation surface Sx2.

Figure 15:
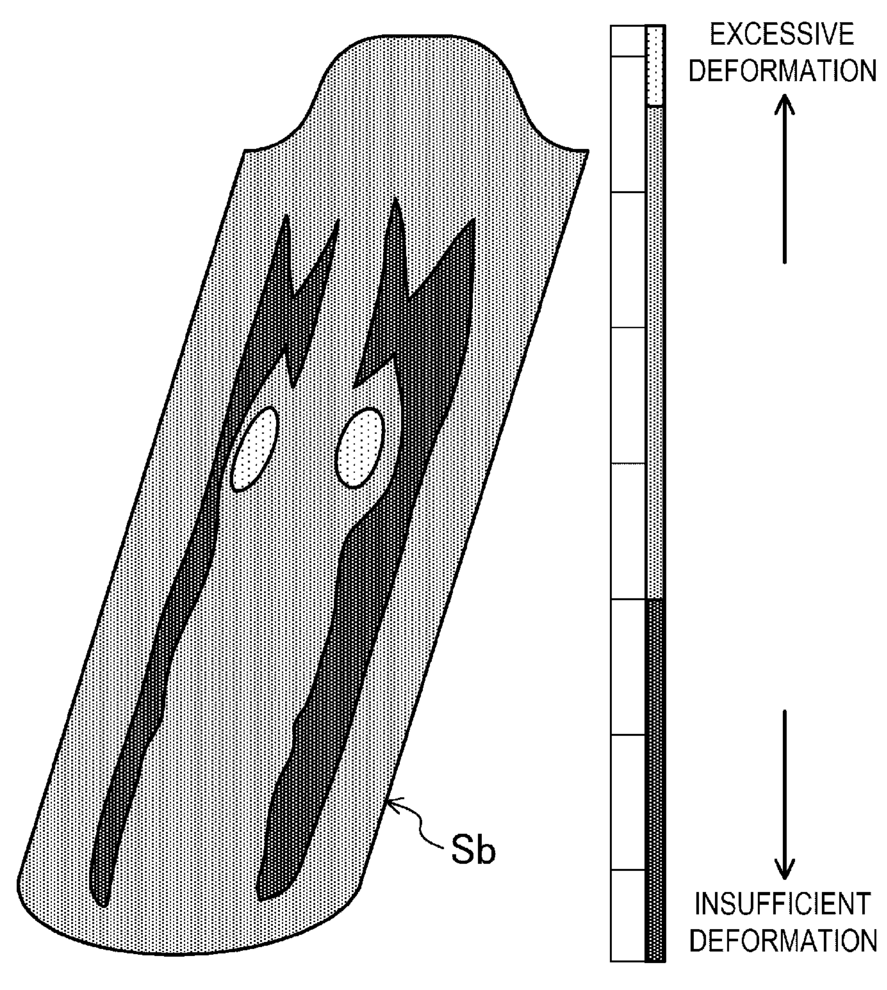
FIG. 15 is a diagram illustrating the deformation result of the curved surface model.
Figure 16:
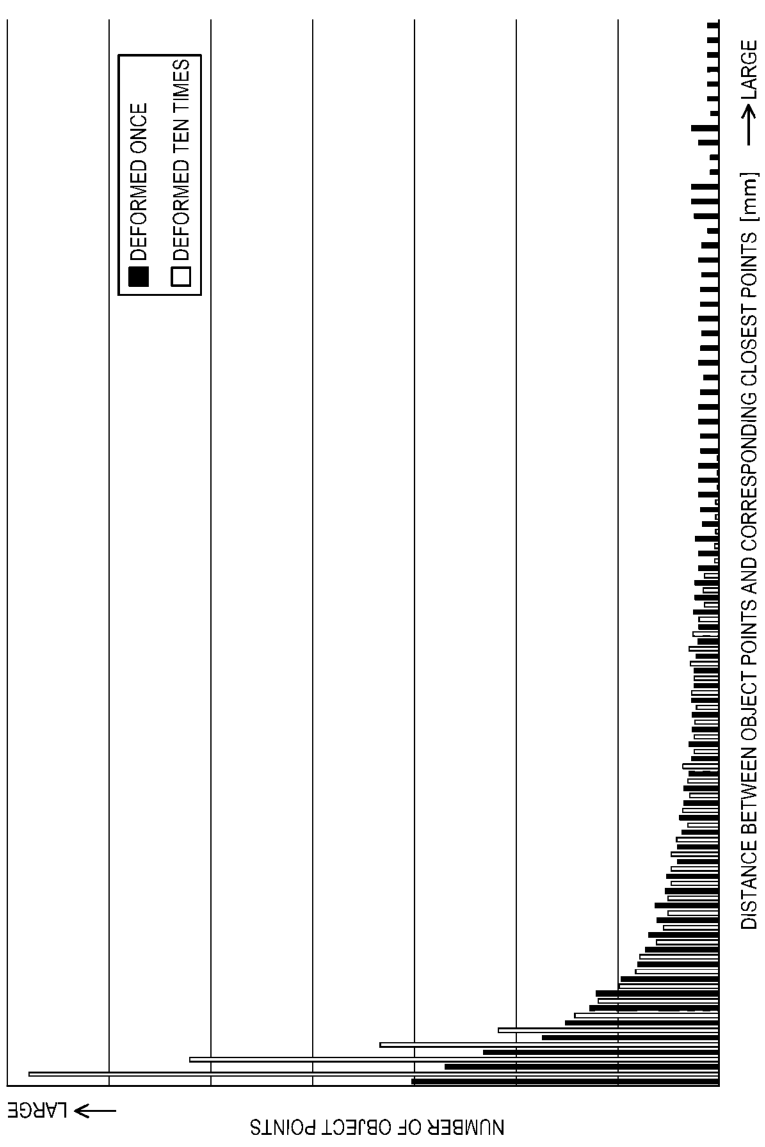
FIG. 16 is a diagram illustrating the result of application of multi-stage deformation to the curved surface model.

As illustrated in FIG. 15, curved surfaces having a relatively small curvature such as the first curved surface Sb1 and the fifth curved surface Sb5 are deformed without excess or deficiency as compared with curved surfaces having a relatively large curvature such as the second curved surface Sb2 and the fourth curved Sb4.

In FIG. 16, the fitting results are compared between the case of deformation in one step (when N=1 in FIG. 8) and the case of deformation in ten steps (when N=10 in FIG. 8). As can be seen from the figure, when the curved surface model Sb is deformed in ten steps, the distance between the closest point H on the curved surface model Sb after deformation and the measurement point Q corresponding to the closest point H is generally smaller than in the deformation of the curved surface model Sb in one step. This means that the deformation at multiple stages achieves more accurate fitting.

Other Embodiments

Although the structure using the B-Spline surface as the free curved surface has been described in the embodiment described above, the present disclosure is not limited to this structure. For example, a Bezier curved surface, a NURBS curved surface, or the like can be used instead of the B-Spline surface illustrated in formula (1) and the like.

In addition, although the structure that uses, as the object points, the measurement points Q obtained by measuring the surface shape of the metal mold is illustrated in the embodiment described above, the present disclosure is not limited to this structure. For example, the numerical data used at the time of new production of the metal mold may be used as the object points. That is, the technology disclosed herein can be used for applications other than reverse engineering of the metal mold.

Furthermore, the metal mold for the outer panel component of an automobile is illustrated as the metal mold in the specific example described above, the application target of the present disclosure is not limited to this example. The present disclosure can be applied to metal molds for inner panel components, metal molds for frame components, and any other metal molds. In addition, the method according to the present disclosure is useful not only at the time of new production of a metal mold but also at the time of maintenance of a metal mold such as a repair of secular change.

Furthermore, although the structure that uses the closest points H on the curved surface model S are illustrated as the deformation target points in the embodiment described above, the present disclosure is not limited to this structure. Points other than the closest points H can be the deformation target points.

In addition, although a computer having one CPU 3 is illustrated as an example of the computer 1 in the embodiment described above, the structure of the computer 1 is not limited to this structure. The computer 1 also may be a parallel computer such as a supercomputer or a PC cluster. When the computer 1 is a parallel computer, the curved surface fitting program 29 is executed by a plurality of calculators.

As described above, the present disclosure is useful for manufacturing and maintaining various metal molds such as metal molds for outer panel components and has industrial applicability.

What is claimed is:

1. A curved surface fitting method for fitting a curved surface model set in a three-dimensional space to a plurality of object points of an object to be modeled set in the three-dimensional space by causing a computer to perform free-form deformation (FFD), the method comprising:

a control point setting process of setting a plurality of control points of a three-dimensional shape surrounding the curved surface model;

a deformation target point setting process of setting, on the curved surface model, a plurality of deformation target points corresponding to the plurality of object points, the plurality of deformation target points on the curved surface model being points on the curved surface model being closest to the plurality of object points of the object, respectively;

a movement amount determination process of determining movement amounts of the plurality of control points, respectively, by executing a least squares method so as to minimize a total value of the movement amounts obtained by adding up squares of distances between the plurality of deformation target points and the plurality of object points corresponding to the plurality of deformation target points; and an FFD execution process of updating the plurality of control points to new control points based on the movement amounts to deform the three-dimensional shape and fitting the curved surface model to the plurality of object points of the deformed three-dimensional shape by executing the free-form deformation.

2. The curved surface fitting method according to claim 1, wherein the plurality of object points include a plurality of measurement points obtained by measuring a surface shape of a metal mold as the object.

3. The curved surface fitting method according to claim 1, wherein the curved surface model includes a combination of curved surfaces, and the control point setting process, the deformation target point setting process, the movement amount determination process, and the FFD execution process are executed so as to deform the combination of curved surfaces at a same time.

4. The curved surface fitting method according to claim 1, wherein the curved surface model includes a combination of a curved surface that partitions a domain of the curved surface model and a trimmed surface obtained by trimming the curved surface, and the control point setting process, the deformation target point setting process, the movement amount determination process, and the FFD execution process are executed on a boundary between the curved surface and the trimmed surface.

5. The curved surface fitting method according to claim 1, wherein the free-form deformation is repeatedly executed a plurality of times by dividing the movement amounts determined in the movement amount determination process and performing the FFD execution process based on the divided movement amounts.

6. The curved surface fitting method according to claim 1, further comprising:

a process of extrapolating a curved surface to the curved surface model; and a process of setting the plurality of deformation target points on the extrapolated curved surface.

7. The curved surface fitting method according to claim 6, further comprising:

a process of adding the plurality of object points so as to correspond to the extrapolated curved surface.

8. The curved surface fitting method according to claim 1, wherein the control point setting process sets a volume of the three-dimensional shape that covers the curved surface model and disposes the plurality of control points in the volume.

9. A curved surface fitting device including a computer having a calculation unit, the curved surface fitting device fitting a curved surface model set in a three-dimensional space to a plurality of object points of an object to be modeled set in the three-dimensional space by causing the computer to perform free-form deformation (FFD), the calculation unit comprising:

a control point setting unit that sets a plurality of control points of a three-dimensional shape surrounding the curved surface model;

a deformation target point setting unit that sets, on the curved surface model, a plurality of deformation target points corresponding to the plurality of object points, the plurality of deformation target points on the curved surface model being points on the curved surface model being closest to the plurality of object points on the object, respectively;

a movement amount determination unit that determines movement amounts of the plurality of control points, respectively, by executing a least squares method so as to minimize a total value of the movement amounts obtained by adding up squares of distances between the plurality of deformation target points and the plurality of object points corresponding to the plurality of deformation target points; and an FFD execution unit that updates the plurality of control points to new control points based on the movement amounts to deform the three-dimensional shape and fits the curved surface model to the plurality of object points of the deformed three-dimensional shape by executing the free-form deformation.

10. The curved surface fitting method according to claim 2, wherein the curved surface model includes a combination of curved surfaces, and the control point setting process, the deformation target point setting process, the movement amount determination process, and the FFD execution process are executed so as to deform the combination of curved surfaces at a same time.

11. The curved surface fitting method according to claim 10, wherein the curved surface model includes a combination of a curved surface that partitions a domain of the curved surface model and a trimmed surface obtained by trimming the curved surface, and the control point setting process, the deformation target point setting process, the movement amount determination process, and the FFD execution process are executed on a boundary between the curved surface and the trimmed surface.

12. The curved surface fitting method according to claim 11, wherein the FFD is repeatedly executed a plurality of times by dividing the movement amounts determined in the movement amount determination process and performing the FFD execution process based on the divided movement amounts.

13. The curved surface fitting method according to claim 1, wherein the curved surface model includes a combination of curved surfaces, and the control point setting process, the deformation target point setting process, the movement amount determination process, and the FFD execution process are executed so as to deform the combination of curved surfaces at a same time.

14. The curved surface fitting method according to claim 13, wherein the curved surface model includes a combination of a curved surface that partitions a domain of the curved surface model and a trimmed surface obtained by trimming the curved surface, and the control point setting process, the deformation target point setting process, the movement amount determination process, and the FFD execution process are executed on a boundary between the curved surface and the trimmed surface.

15. The curved surface fitting method according to claim 3, wherein the curved surface model includes a combination of a curved surface that partitions a domain of the curved surface model and a trimmed surface obtained by trimming the curved surface, and the control point setting process, the deformation target point setting process, the movement amount determination process, and the FFD execution process are executed on a boundary between the curved surface and the trimmed surface.

16. The curved surface fitting method according to claim 15, wherein the FFD is repeatedly executed a plurality of times by dividing the movement amounts determined in the movement amount determination process and performing the FFD execution process based on the divided movement amounts.

17. The curved surface fitting method according to claim 4, wherein the FFD is repeatedly executed a plurality of times by dividing the movement amounts determined in the movement amount determination process and performing the FFD execution process based on the divided movement amounts.

* * * * *